(12) United States Patent
Czerwiec et al.

(10) Patent No.: US 7,660,409 B1
(45) Date of Patent: Feb. 9, 2010

(54) MULTI-DWELLING UNIT MODULE FOR PASSIVE OPTICAL NETWORKS

(75) Inventors: Richard Marion Czerwiec, Raleigh, NC (US); Manal Afify, Raleigh, NC (US); Atahan Tuzel, Raleigh, NC (US); Barry Lee Moffitt, Cary, NC (US); Joseph Lee Smith, Fuquay Varina, NC (US); Anthony Peter Noto, Knightdale, NC (US); David Charles Fargo, Cary, NC (US); Bobby Lane English, Raleigh, NC (US); John David Boyle, Cary, NC (US); Alain Granger, Raleigh, NC (US); Jak Yaemsiri, Raleigh, NC (US); Andreas Flach, Wake Forest, NC (US); John Scott Cao, Raleigh, NC (US); Ali Rezaki, Antwerp (BE); Charles Pearse, Ottawa (CA); Bakri Aboukarr, Ottawa (CA); Arkin Aydin, Nepean (CA); Angelo Arlotta, Ottawa (CA); Nicholas Adam Bundza, Ottawa (CA)

(73) Assignee: Alcatel Lucent, Paris (FR)

( * ) Notice: Subject to any disclaimer, the term of this patent is extended or adjusted under 35 U.S.C. 154(b) by 959 days.

(21) Appl. No.: 11/026,123

(22) Filed: Dec. 30, 2004

Related U.S. Application Data

(60) Provisional application No. 60/574,296, filed on May 25, 2004.

(51) Int. Cl.
*H04M 1/00* (2006.01)
*H04M 9/00* (2006.01)

(52) U.S. Cl. .......................... 379/413.02; 379/399.01; 379/325

(58) Field of Classification Search ............ 379/399.01, 379/412, 413, 413.01–413.04, 325, 326, 379/328, 331
See application file for complete search history.

(56) References Cited

U.S. PATENT DOCUMENTS

| | | | | |
|---|---|---|---|---|
| 6,157,538 | A * | 12/2000 | Ali et al. ...................... | 361/704 |
| 6,299,526 | B1 * | 10/2001 | Cowan et al. ................ | 454/184 |
| 6,714,647 | B1 * | 3/2004 | Cowan et al. .......... | 379/413.02 |
| 7,245,717 | B2 * | 7/2007 | Fritz et al. ............. | 379/413.04 |
| 2003/0198341 | A1 * | 10/2003 | Smith et al. ............ | 379/413.03 |
| 2007/0110223 | A1 * | 5/2007 | Pisczak et al. ......... | 379/413.04 |
| 2008/0260142 | A1 * | 10/2008 | Swam et al. ........... | 379/413.04 |

* cited by examiner

*Primary Examiner*—Quoc D Tran
(74) *Attorney, Agent, or Firm*—Galasso & Associates LP

(57) ABSTRACT

A multi-dwelling unit (MDU) module is configured for providing telephony communicating services and non-telephony services. The MDU module includes a motherboard and a plurality of service units connected to the motherboard. Each one of said service units and the motherboard are jointly configured for providing non-telephony service and telephony service to a plurality of service subscribers. The motherboard is configured for providing overload power management to limit power consumption associated with said telephony services during an overload condition and for providing lifeline power management to limit power consumption associated with said non-telephony services during a power outage condition. The MDU module optionally includes lightning primary surge protection blocks configured for being connected to the service units. The MDU module includes a passive heat dissipation assembly that is configured for absorbing heat generated by the motherboard and the service units and for passively dissipating the heat.

6 Claims, 7 Drawing Sheets

MULTI-DWELLING UNIT MODULE FOR PASSIVE OPTICAL NETWORKS

CROSS REFERENCE TO RELATED APPLICATIONS

This application claims priority to co-pending United States Provisional Patent Application having Ser. No. 60/574,296, filed on May 25, 2004, entitled "MDU Architecture", having a common applicant herewith and being incorporated herein in its entirety by reference.

FIELD OF THE DISCLOSURE

The disclosures made herein relate generally to network elements in passive optical networks and, more particularly, to multi-dwelling unit modules.

BACKGROUND

A multi-dwelling unit (MDU) module is an interface module configured for providing telephony, video and data communications service to a plurality of service subscribers within a single building or group of associated buildings (multi-subscriber facilities). Examples of a multi-dwelling unit include, but are not limited to, a standalone apartment building, a multi-building apartment complex, one or more units of townhomes and the like. Multiple Dwelling Units (MDUs) are preferred by tenants who need high-speed Internet access (e.g., via the Internet) from home. Accordingly, MDUs offering such high-speed Internet access enhance the value of the property, create new revenue streams and increase tenant satisfaction.

Known architectures for conventional MDU modules include brickyard architecture, monolithic architecture and hybrid-brick architecture. The brickyard architecture comprises a host brick (i.e., a host unit) and a plurality of service bricks (i.e., service units). The monolithic architecture comprises a single card that supports required network and customer service interfaces. The hybrid-brick architecture comprises one motherboard and a plurality of service units. Each of these three different MDU module architectures offers different characteristics relative to parameters such as power, reliability, performance and cost. Accordingly, selection of a particular MDU module architecture is largely dependent on an associated application and its requirements.

Existing MDU modules, which are referred to herein as conventional MDU modules, are known to have one or more shortcomings. Examples of such shortcomings include, but are not limited to, shortcomings associated with powering strategies, shortcomings associated with environmental hardening, shortcomings associated with deployment strategies, shortcomings associated with cooling functionality, shortcomings associated with types of supported data communication formats, and shortcomings associated with video service strategies. These shortcomings adversely impact the breadth, quality and value of service associated with such conventional MDU modules.

Therefore, a MDU module that overcomes one or more shortcomings associated with conventional MDU modules would be useful, advantageous and novel.

SUMMARY OF THE DISCLOSURE

The inventive disclosures made herein provide for a MDU module, which is an optical network terminal (ONT) unit for a multi-dwelling application within a passive optical network, that overcomes one or more shortcomings associated with conventional MDU modules. More specifically, an MDU module in accordance with the inventive disclosures made herein provide advantageous powering strategies, environmental hardening, deployment strategies, cooling functionality, data communication format support and video service strategies. A key differentiator from conventional ONT units is that an MDU module in accordance with the inventive disclosures made herein is capable of deployment for supporting multiple living units as opposed to a single living unit. The MDU module terminates the PON network at a multi-dwelling unit location (e.g., in an MDU closet/terminal room/ or outside the building) and VDSL, POTS, and/or CATV extensions are routed from the MDU module to individual customer sites. Accordingly, MDU modules in accordance with the inventive disclosures made herein advantageously impacts the breadth, quality and value of telephony and non-telephony services.

To support various deployment strategies and applications, MDU modules in accordance with the inventive disclosures made herein have hybrid brick architecture. This architecture also readily lends itself to an easy migration path towards supporting future service customer interfaces (e.g. DS1, Ethernet, etc). Compared to monolithic architecture and brickyard architecture, the hybrid brick architecture offers greater flexibility relative to the monolithic architecture and offers a desirable cost proposition relative to the brickyard architecture.

MDU modules in accordance with the inventive disclosures made herein include a number of specific attributes that are advantageous relative to conventional MDU modules. One such attribute is power management, which during overload or power outage conditions, is facilitated in a manner that balances available power with service demands. If the MDU module is required to ring an inordinate number of lines (e.g., in excess of requirements), it will partial ring or lower voltage ring until load returns to normal limits without affecting other services. To maintain lifeline service during a power outage, it will pause video and data services and provide several hours of POTS (plain old telephone service) through local batteries, restoring all services return upon return of line power. Another such attribute is the ability to offer POTS, VDSL Data and video services with flexibility to provide video over either RF overlay or in-band depending on the customer requirements. Flexibility to selectively change service units for services such as, for example, VDSL service, POTS service, Ethernet service, DS1 service and E1 service is another one of such attributes. Accordingly, such service units are combo service units capable of providing telephony service (e.g., POTS) and data communication service (e.g., VDSL). Still another such attribute is the ability to support intra-building and inter-building applications with internal primary surge protection being provided and allowing services to be deployed within 1 K-ft for FTTN (fiber-to-the-neighborhood), fiber-to-the-house and building side mount applications. Heat dissipation techniques, which allow for convection cooling of the MDU module without venting or internal fans, is yet another one of such attributes.

In one embodiment, a multi-dwelling unit module in accordance with the inventive disclosures made herein includes a plurality of service units, a motherboard and a passive heat dissipating assembly. The plurality of service units are each configured for providing non-telephony service and telephony service to a plurality of service subscribers. Each one of the service units includes a passive heat-conducting member. The motherboard has each one of the service units connected thereto and configured for interacting with the service units for providing the non-telephony service and telephony service to the service subscribers. The motherboard includes a passive heat-conducting member. The passive heat dissipation assembly is configured for absorbing and dissipating heat. The passive heat conducting member of each one of the service units and the passive heat conducting member of the motherboard are conductively engaged with the passive heat dissipation assembly, thereby enabling heat generated by the service units and the motherboard to be absorbed by the passive heat dissipation assembly and to be convectively dissipated from the passive heat dissipation assembly.

In another embodiment, a multi-dwelling unit (MDU) module comprises a motherboard and a plurality of service units. The plurality of service units are connected to the motherboard. Each one of the service units includes a respective inner service unit card detachably attached to the motherboard and a respective outer service unit card detachably attached to the respective inner service unit card. The respective inner service unit card is positioned between the motherboard and the respective outer service unit card when a corresponding one of the service units is connected to the motherboard In another embodiment, a multi-dwelling unit (MDU) module comprises a plurality of service units and a motherboard configured for having each one of the service units connected thereto. Each one of the service units and the motherboard are jointly configured for providing non-telephony service and telephony service to a plurality of service subscribers. The motherboard is configured for providing overload power management to limit power consumption associated with the telephony service during an overload condition and for providing lifeline power management to limit power consumption associated with the non-telephony service during a power outage condition.

These and other objects and embodiments of the inventive disclosures made herein will become readily apparent upon further review of the following specification and associated drawings.

BRIEF DESCRIPTION OF THE DRAWING FIGURES

Figure 2:
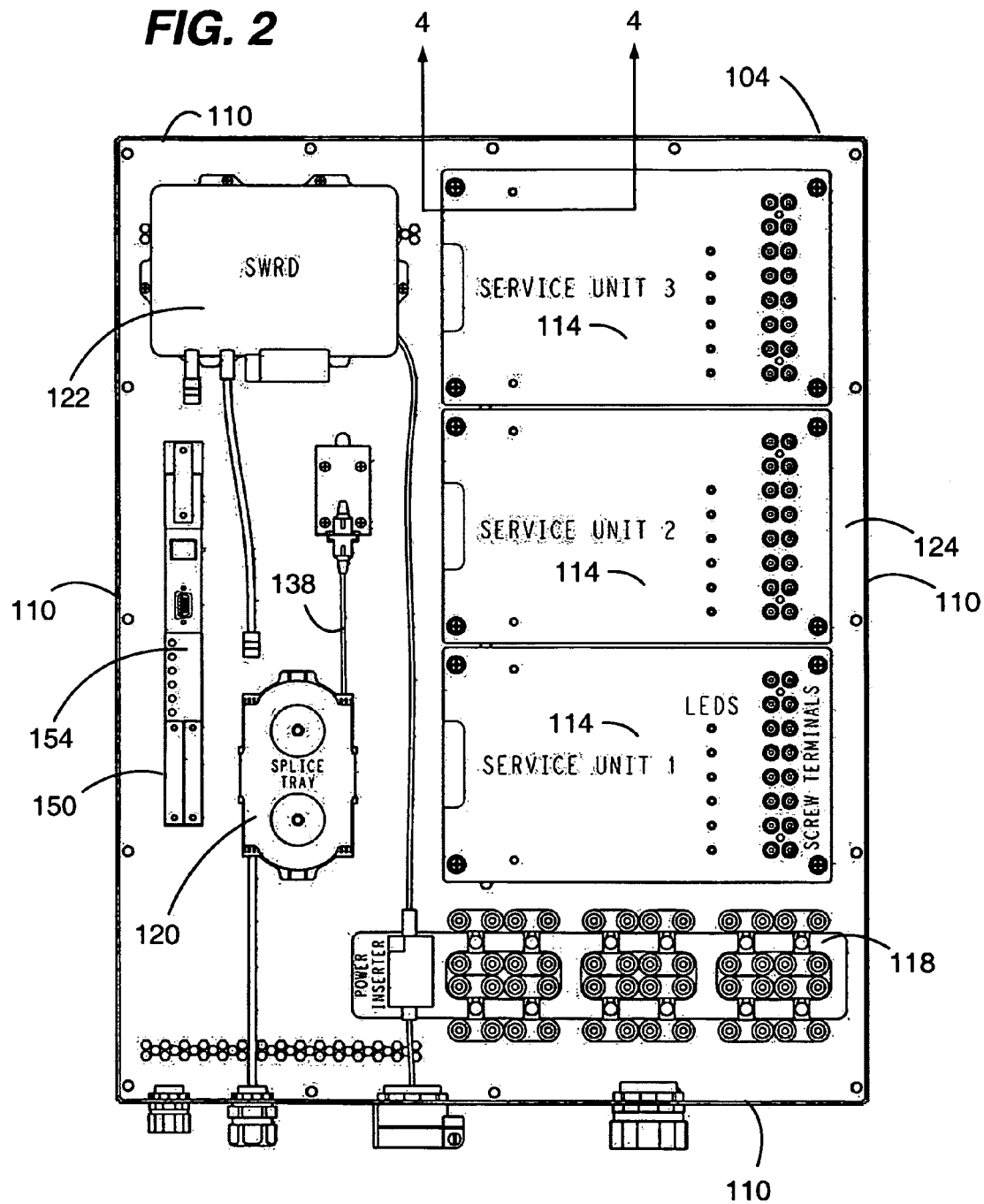
FIG. 2 is a front view of the MDU module depicted in FIG. 1.
Figure 4:
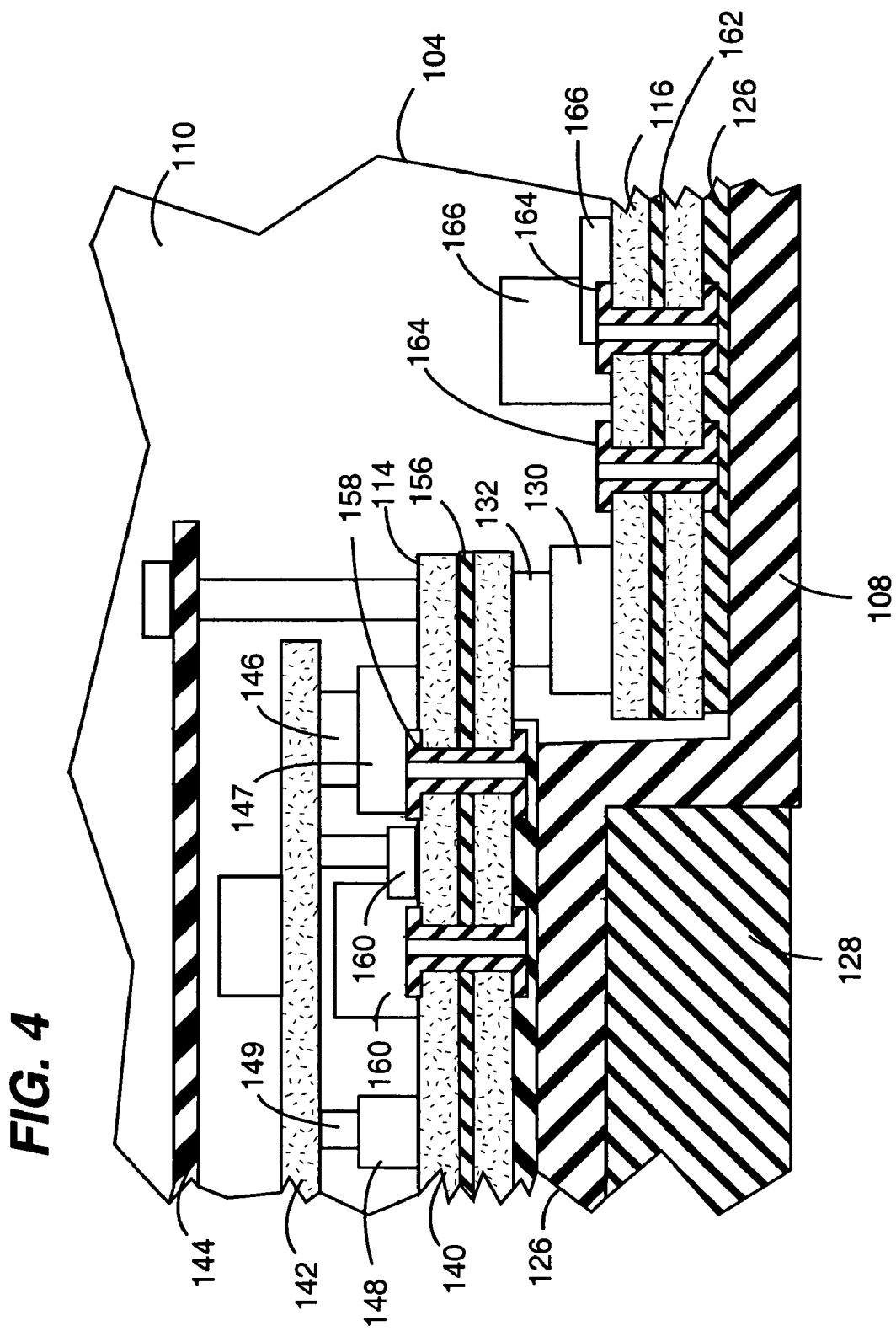

FIG. 4. is a cross sectional view taken along the line 4-4 in FIG. 2.

Figure 1:
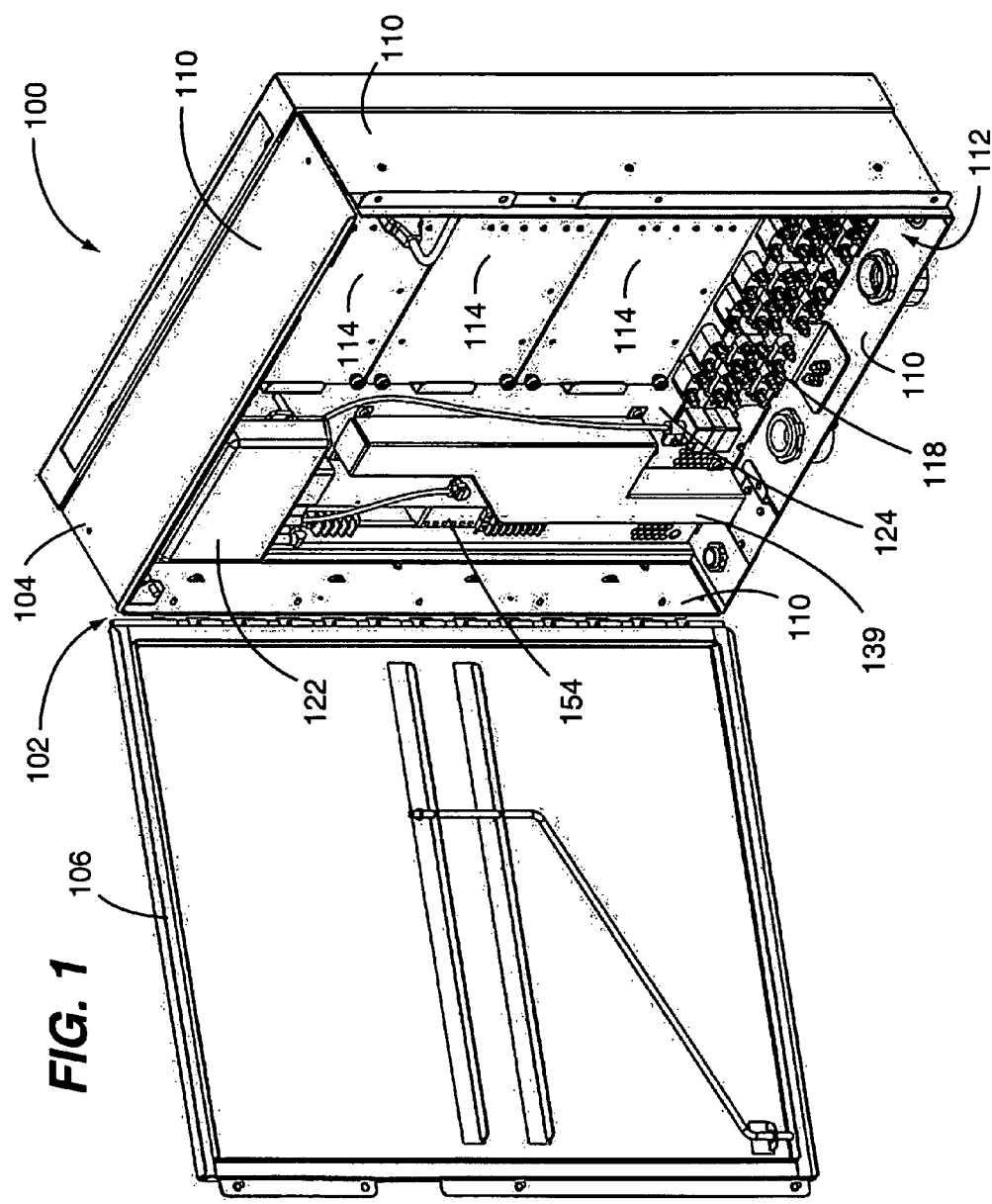
FIG. 1 depicts an embodiment of a multi-dwelling unit (MDU) module 100 in accordance with the inventive disclosures made herein.
Figure 5:
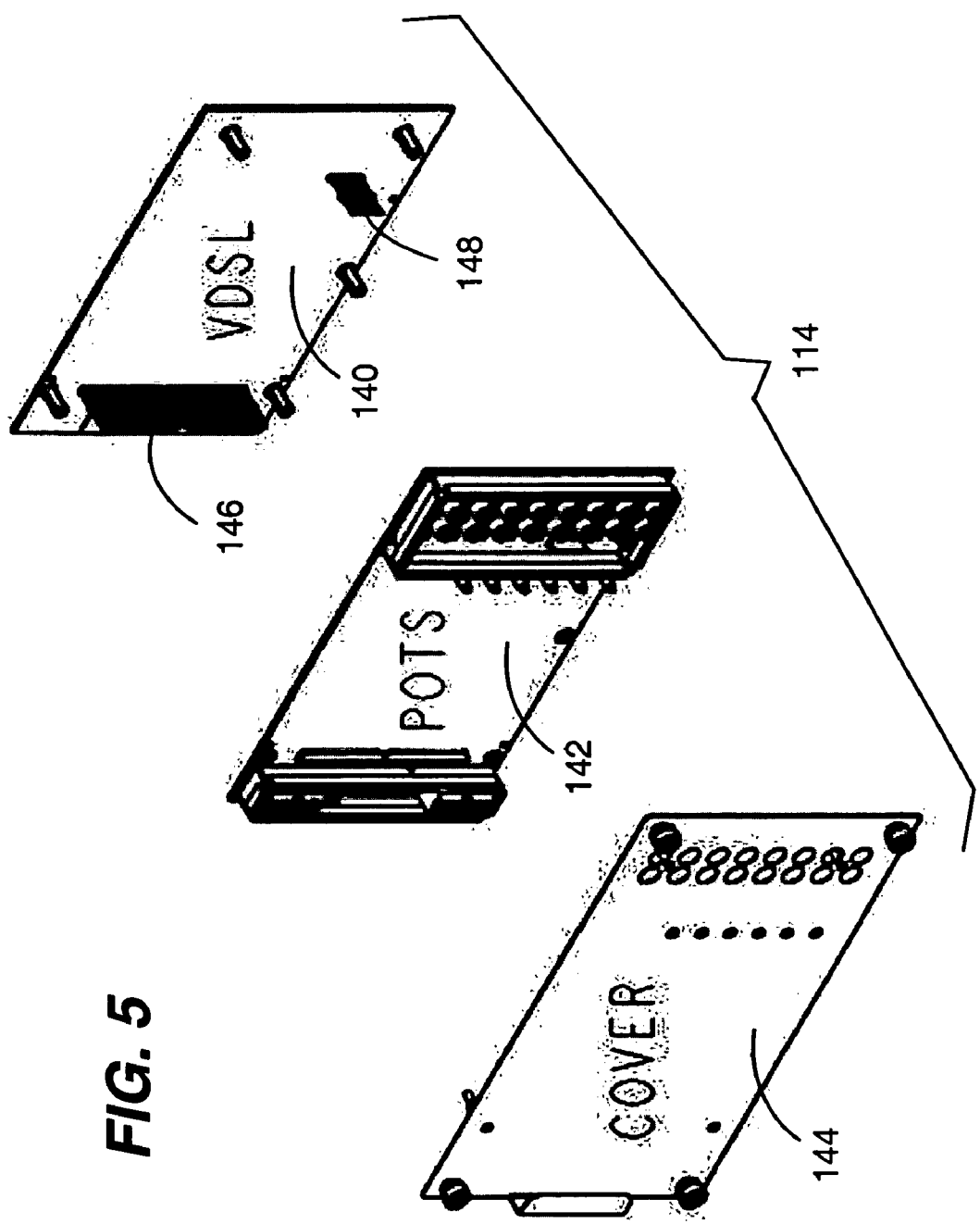

FIG. 5 is an exploded view of a service unit of the MDU module depicted in FIG. 1.

Figure 6:
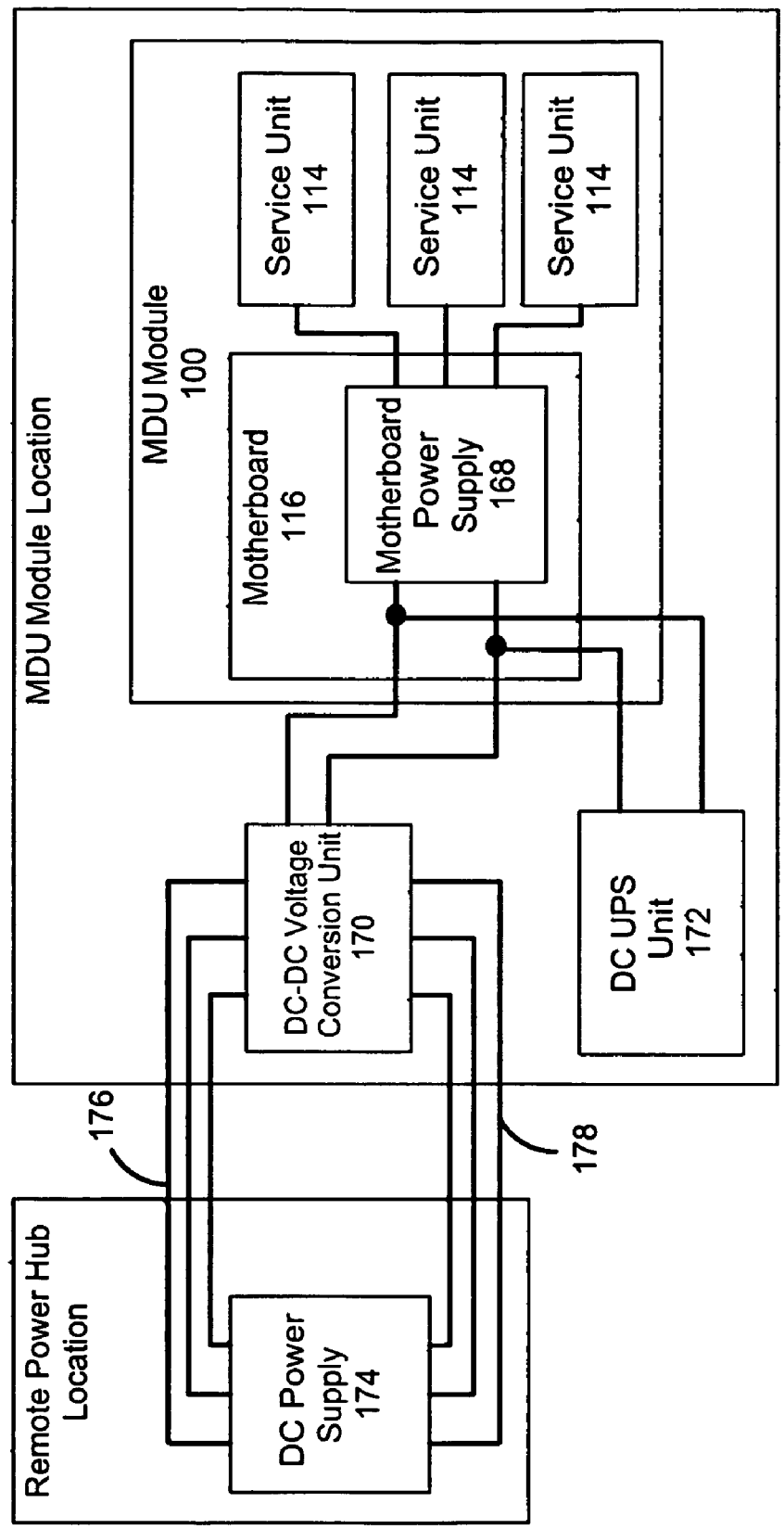

FIG. 6 depicts an embodiment of a powering strategy for the MDU module depicted in FIG. 1.

Figure 7:
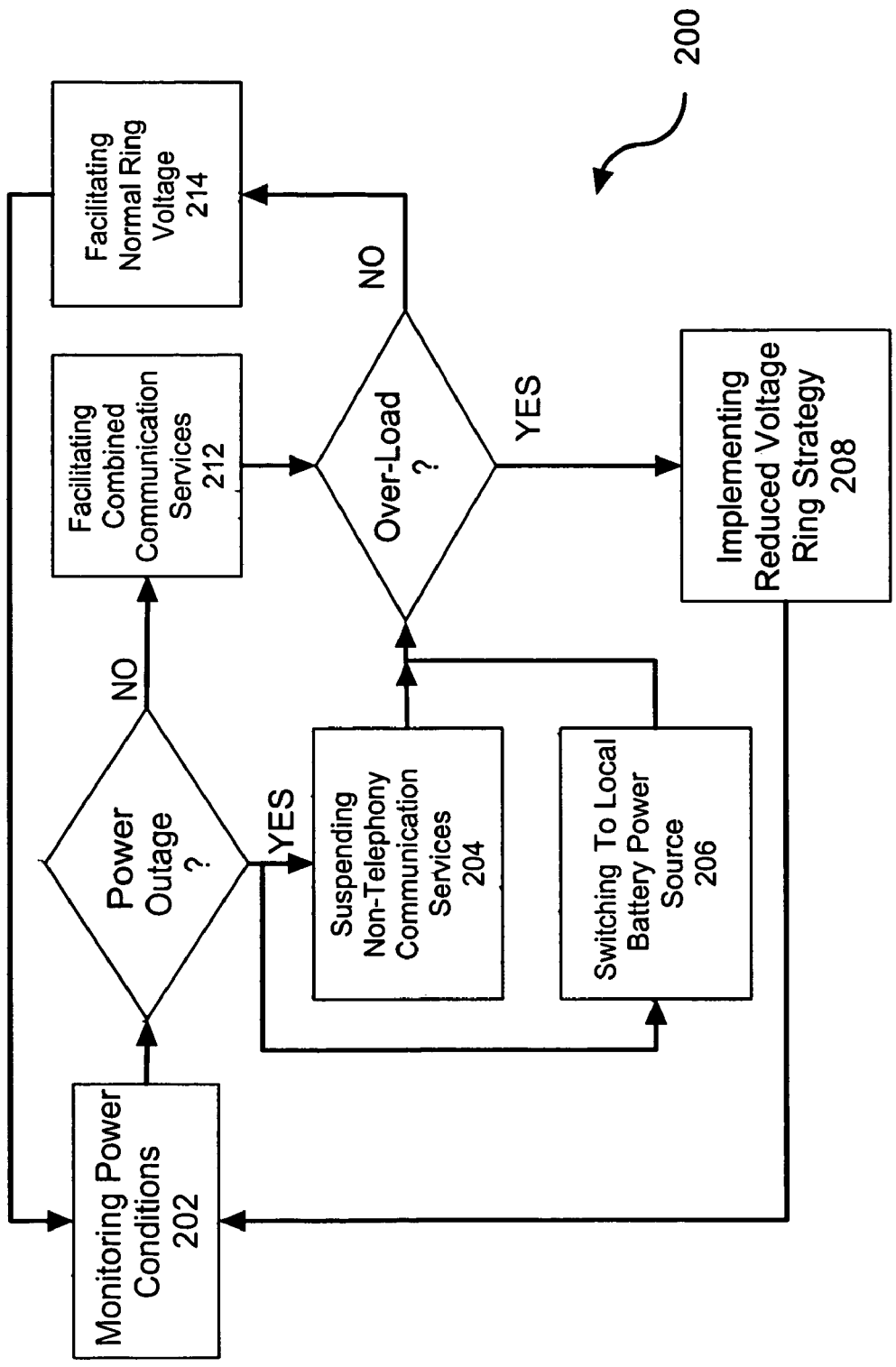

FIG. 7 depicts a method for facilitating power management functionality for a MDU module in accordance with the inventive disclosures made herein.

DETAILED DESCRIPTION OF THE DRAWING FIGURES

FIGS. 1 and 2 depict an embodiment of a multi-dwelling unit (MDU) module 100 in accordance with the inventive disclosures made herein. The MDU module 100 includes an enclosure 102 having a pan 104 and a cover 106. The pan 104 includes an interior space having structural and operation components of the MDU module 100 contained therein. The pan 104 is made from a heat conducting material (e.g., steel) and includes a rear 108 and side walls 110.

The cover 106 is mounted on the pan 104 and is movable between an open position and a closed position, such as via a hinge provided between the pan 104 and the cover 106. When in the open position, access to the structural and operation components of the MDU module 100 (i.e., contents of the MDU module 100) through a main access opening 112 of the pan is provided. When in the closed position, the cover 100 is positioned over the access opening 112. In one embodiment, a seal is preferably provided between the pan 104 and the cover 106 for limiting exposure of the contents of the MDU module 200 to potentially damaging conditions (e.g., rain, sprinkler water, hail, vandalism, etc). Preferably, but not necessarily, the cover is lockable in the closed position.

Referring now to FIGS. 1-4, the structural and operational components of the MDU module 100 are configured for providing MDU module functionality. Such functionality includes integrating VDSL (very-high data rate Digital Service Line) and POTS (plain old telephone service) interfaces as well as a CATV compatible RF video output and an Ethernet port for a video return channel. To provide such functionality, the MDU module 100 utilizes a PON protocol such as, for example, broadband PON (BPON) technology for fiber extension from a corresponding central office. It is disclosed herein that such BPON communication protocol may be upgradeable to a higher rate protocol such as, for example, Giga-byte PON (GPON). The structural and operational components of the MDU module 100 that are attached to the pan 104 include, but are not limited to, a plurality of service units 114, a motherboard 116, a primary surge protector block 118, an optical fiber splice tray 120, a single wire return device (SWRD) 122, a pan divider 124, a plurality of thermal pads 126 and a plurality of heat sink bodies 128.

The service units 114 and the motherboard 116 jointly provide for various telephony service and non-telephony service. Examples of such telephony service include plain old telephone service (POTS). Examples of such non-telephony service include digital subscriber line (DSL) data communication service, video service, Ethernet service, ISDN service and DS1 service. The motherboard 116 is mounted on the pan 104 and each one of the service units 114 are operably attached to the motherboard 116 through a respective motherboard connector 130. Each one of the service units 114 includes a mating connector 132 that engages the respective motherboard connector 130. Through such mating connector arrangement, the service units 114 and the motherboard 116 are able to interact for providing MDU functionality.

The motherboard and service unit arrangement depicted in FIGS. 1-4 is representative is of hybrid-brick architecture. As depicted, the hybrid-brick architecture includes the motherboard 116 and the service units 114 (i.e., a single XENON processor architecture with three service units). Preferably, but not necessarily, the motherboard 116 supports all optical, video, power and common circuitry required to support the service units 114. The service units 114 provide customer service interfaces, as required, for telephony service and non-telephony service.

An optical-video daughter card 134, which has optical and video functionality integrated therein, is detachably connected to the motherboard 116 via mating connectors (e.g., not specifically shown). The optical-video daughter card 134 includes an optical input-output port 136 that is optically connected to the optical fiber splice tray 120 by an optical fiber jumper cable assembly 138. A cover 139 is mounted over the optical fiber splice tray 120 and the optical fiber jumper cable assembly 138 for providing protection. By integrating optical and video functionality into the optical-video daughter card 134, revisions and/or updates to such optical and video functionality can be facilitated by replacement of the optical-video daughter card 134 rather than replacement of the motherboard. For example, due to the necessity of multiple vendors of optical triplexers and video receivers to be supported and due to incompatibilities between certain vendors, the optical-video daughter card can be readily replaced to address component incompatibilities and unique requirements (i.e. GPON upgrades). Accordingly, because the optical and video functionality are far more likely to be updated/revised on a more rapid basis than functionality integrated into the motherboard 116, cost and risk associated with unnecessary replacement of the motherboard 116 is dramatically reduced through implementation of the daughter card 134. However, in at least one embodiment of the inventive disclosures made herein, the functionality of the optical-video daughter card 134 is integral with the motherboard 116, thereby eliminating the need for the daughter card 134.

The motherboard assembly, which includes the motherboard 116 and the optical-video daughter card 134, provides for numerous MDU module functionalities and capabilities. Examples of such functionalities and capabilities include, but are not limited to, supporting a PON Optical Interface via a triplexer optical component that separates the optical downstream video and data signals and that provides isolation for the upstream data signal; supporting a PON Video interface via a PON video module that includes a video receiver and video amplifier module; providing the primary DC-to-DC power conversion for MDU module components; providing power management for the non-lifeline and overload conditions; and providing traffic management for all traffic supported by the MDU module. The motherboard 116 preferably includes four external interfaces: a PON optical interface, a RF Video interface, an external power interface and an Ethernet Service Interface. In one embodiment of the motherboard 116, coarse wavelength division multiplexing (WDM) is used to carry three separate optical signals on one single-mode fiber-optic interface of the motherboard 116. For example, downstream and upstream signals between the PON and the OLT are carried on 1490 nm and 1310 nm, respectively, and downstream video overlay is carried on 1550 nm.

Core video function (i.e., RF overlay) of the MDU module 100 consists in a triplexer and video amplifier module, which are comprised by the optical-video daughtercard 134. The SWRD 122 provides a video return channel that is capable of serving 12 video subscribers (e.g., via an 1:12 addressable tap with a 1:16 addressable tap as an objective). The video return channel is a necessary feature of most access products delivering state of the art video services, which allows video subscribers to communicate information back to the video head end. This information may include, but is not limited to, movie selection and control information, channel selection, administrative command acknowledgements, and set-top box initialization from the set top box, etc. The video return channel is tied to the video channel and is always enabled when the video channel is enabled and disabled with the associated video channel. The video return channel is not separately managed from the video forward channel. To properly handle this traffic path, the MDU module 100 must reserve sufficient resources to meet the aggregate traffic demands of the return channels.

Each of the service units 114 supports a plurality of interfaces. Examples of such interfaces include, but are not limited to, a Utopia Interface for data traffic; an extended peripheral bus interface for POTS traffic and control; a power converter distribution interface; a service unit power management interface; a service unit present signals interface, a micro-wire interface for remote inventory/Temp sensor monitoring and a network timing reference interface for POTS and future DS1 synchronization.

In a preferred deployment of the MDU module 100 depicted in FIG. 1, the MDU module 100 has hybrid brick (i.e., hybrid) architecture (e.g., the three service units 114 and the motherboard 116) and is configured for supporting of 24 analog POTS lines and 12 VDSL port interfaces and is readily extendable to provide Voice over IP (VoIP) service. Such a configuration is suitable for a twelve living unit deployment, and provides for intra-building and optional inter-building environmentally-hardened environments. The primary surge protector block 118 support such inter-building deployment strategies. This hybrid MDU architecture provides port-differentiating advantages over conventional MDU modules. For example, the VDSL interfaces of the MDU module 100 in combination with capability for overlay video allows for a flexible video strategy. In view of such a flexible video strategy, service subscribers may choose to use the in-band video strategy made available via the VDSL interfaces or use the overlay video infrastructure. Additionally, the hybrid MDU architecture of the MDU module 100 is capable of supporting Ethernet, DS1, SHDSL, ADSL and ADSL2+ customer interfaces.

Referring to FIGS. 4 and 5, each one of the service cards 114 (e.g., combo POTS/VDSL service cards) includes a base board 140, a daughter card 142 and a cover 144. Each one of the three service units 114 integrates 8 voice and 4 VDSL lines for providing such 24 analog POTS lines and 12 VDSL port interfaces. The base board 140 includes VDSL circuitry for providing the 4 VDSL lines and motherboard interface circuitry. The daughter card 142 includes eight POTS channels. Such 8 voice lines and 4 VDSL lines may be provided on, for example, a double printed circuit card assembly. Preferably, both cards include an ability to perform standardized tests/diagnostics upon command from service providers (e.g., MLT, loopbacks, etc.).

The base board 140, the daughter card 142 and the cover 144 are attached to each other in a stacked arrangement. The stacked arrangement provides for a relatively small form factor, conserving valuable real-estate within the pan 104. The daughter card 142 is attached to the base board 140 and the cover 144 overlies the daughter card 142. The cover 144 provides aesthetic and protective functionality, as well as shielding to ensure compliance with FCC requirements.

Referring specifically to FIG. 4, there are two pair of mating connectors between the base board 140 and the daughter card 142. A first pair (146, 147) of mating connectors bridge TIP and RING connections between POTS interfaces on the daughter card 142 and VDSL interfaces on the base board 140. A second pair (148, 149) of mating connectors provide for digital and power connections between the base board 140 and the daughter card 142.

Rather than VDSL, one or more of the service units 114 may be configured (e.g., via upgrading software) for supporting other data communication protocols such as ADSL, ADSL2 and ADSL2+. In this manner, the hybrid brick MDU architecture and modular service unit arrangement provide flexibility for configuring the service units 114 for a variety of different types of communication services (e.g., VDSL/POTS/Ethernet/DS1/E1 service). Additionally, in at least one embodiment, each one of the service units 114 preferably supports both voice over ATM (VOATM) and voice over IP (VoIP) applications.

Figure 3:
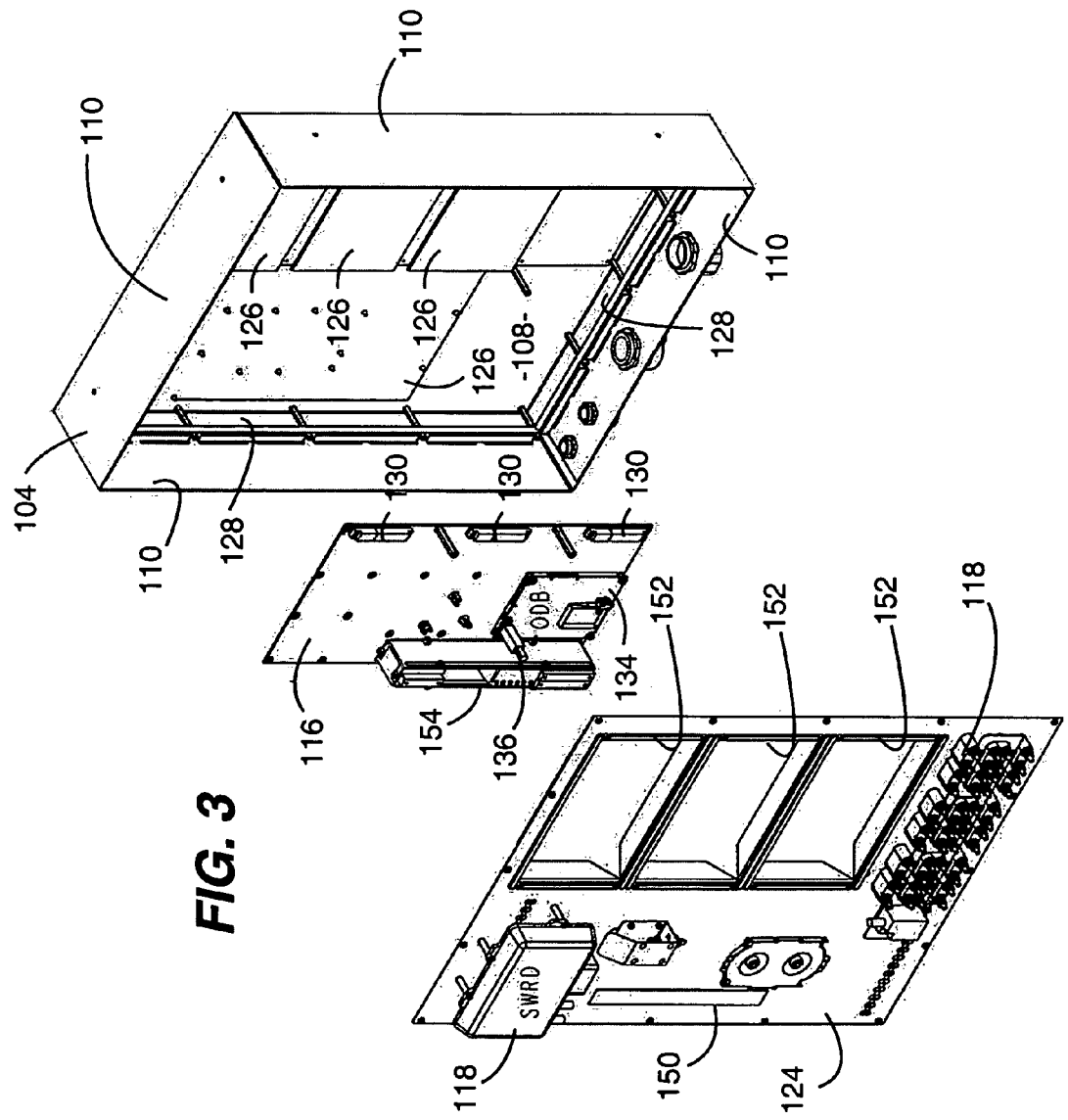
FIG. 3 is a partial exploded view of the MDU module depicted in FIG. 2.

Referring to FIGS. 2 and 3, the primary surge protector block 118, the optical fiber splice tray 120 and the SWRD 122 are mounted on the pan divider 124. The pan divider 124 is attached to the pan 104 within the interior space of the pan 104. The pan divider 124 includes a motherboard connector block access opening 150 and a plurality of service unit access openings 152. A connector block 154 of the motherboard 116 is accessible through the motherboard connector block access opening 150 of the pan divider 124. The thermal pads 126 that correspond to the service units 114 are accessible through the service unit access openings 152 of the pan divider 124.

Turning now to discussion of thermal cooling mechanisms for the MDU module 100, the MDU module 100 is preferably configured for dissipating internally generated heat passively by means of conduction and convention without venting or internal fans. Other modes of heat transfer (internal convection, radiation, and external radiation) are relatively small contributors to the overall heat dissipation. Such a passive heat dissipating mechanism is advantageous in that it eliminates moving components, reduces energy consumption, reduces operational and manufacturing costs, and saves interior space.

Referring to FIGS. 3 and 4, the base board 140 of each of the service units 114 (only one service unit shown in FIG. 4) include a thermal plane 156, a plurality of heat conducting members 158 extending through the baseboard 140 and a plurality of heat-generating devices 160 mounted on one or both major surfaces of the base board 140. The motherboard 116 includes a thermal plane 162, a plurality of heat conducting members 164 extending through the motherboard 116 and a plurality of heat generating devices 166 mounted on one or both major surfaces of the motherboard 116. The motherboard 116 is heat-sunk to the rear wall 108 of the pan 104 through a respective one of the thermal pads 126. Similarly, each one of the service units 114 is heat-sunk to the rear wall 104 of the pan 104 through a respective one of the thermal pads 126. The heat sink body 128 is engaged with the rear wall 108 of the pan 104 for increasing thermal absorption capacity. The thermal pads 126, pan 104 and the heat sink bodies 118 represent a passive heat dissipation assembly in accordance with the inventive disclosures made herein. Such a passive heat dissipation assembly is configured for enabling heat generated by heat generating components of the service units 114 and the motherboard 116 to be absorbed by the passive heat dissipation assembly and to be convectively dissipated from the passive heat dissipation assembly.

Accordingly, heat is conducted through the base boards 140 of the service units 114 and through the motherboard 116 and through the thermal pad 126 into the rear wall of the pan 104. As the heat is absorbed by the rear wall 108 of the pan 104, it is dissipated via convention to the air outside of the MDU module 100. Because the base board 140 of the service units 114 and the motherboard 116 are heat-sunk to the rear wall 108, it is preferred that the components of the base boards 140 and the motherboard 116 to have relatively high service temperature ratings and that the components of the base boards 140 and the motherboard directly adjacent the rear wall 108 be kept to a minimum quantity and have relatively low profiles.

The base board 140 of each one of the service units 114 represents a respective inner service unit card that is attached to the motherboard 116 and the POTS daughter card 142 represents a respective outer service unit card attached to the inner service unit card. Accordingly, the respective inner service unit card of each one of the service units 114 is positioned between the motherboard 116 and the respective outer service unit card when the respective one of the service units 114 is connected to the motherboard 116. Preferably, the inner service unit card exclusively carries the heat generating components of the circuitry that provides non-telephony service (e.g., the DSL circuitry) and the outer service unit card exclusively carries heat generating components of circuitry that provides telephony service. In general, the heat generating components of the circuitry that provides non-telephony service generate a significantly higher degree of heat than do the heat generating components of circuitry that provides telephony service. Depending on the specific application, the outer service unit card may be omitted for one or more of the service units 114.

Turning now to discussion of powering strategies and referring to FIG. 6, it will be appreciated that the MDU module 100 is selectively powerable by one of two possible power sources. FIG. 6 depicts an embodiment of a powering strategy for the MDU module 100 that allows for network based powering and local powering. The motherboard 116 of the MDU module includes a motherboard power supply 168, which is configured for receiving input power at a specified input voltage (e.g., 48 VDC) and for appropriately regulating voltage (e.g., to one or more lesser voltages) to meet the voltage requirements of the various components of the service units 114 and the motherboard 116.

The motherboard power supply 168 is configured for receiving input power at the specified input voltage from either a DC-DC voltage conversion unit 170 at the MDU module location or from a DC uninterruptible poser supply (UPS) unit 172. The DC-DC voltage conversion unit converts network-supplied power of a respective supply voltage (e.g., +/−130 VDC) provided from a DC power source 174 at an upstream location (e.g., a remote power hub) to the specified input voltage. The network-supplied power is provided over a plurality of parallel telecomm twisted pairs (i.e., a TIP conductor 176 and a RING conductor 178, or in some cases coax providing required voltage) that extend between the DC power source 174 at the upstream location and the DC-DC voltage conversion unit at the MDU module location.

In an alternate embodiment (not specifically shown), the DC-DC voltage conversion unit 170 is replaced with an AC-DC voltage conversion unit, the DC power supply 174 is replaced with an AC power supply and the plurality of twisted pairs are replaced with a coaxial cable. In such an embodiment, 60-90 volts RMS power is an example of such power provided from the AC power supply over the coaxial cable to the AC-DC voltage conversion unit.

The necessity for utilizing a plurality of parallel twisted pairs includes accommodation of required electrical current requirements of the motherboard power supply 168, accommodating electrical current limitations of the twisted pairs (e.g., 100 VA per twisted pair) and/or minimizing power loss due to the feeder line resistance. For example, two or more parallel pairs of 22, 24 or 26 AWG telecom twisted pair wires may be used to provide such network-supplied power to the DC-DC voltage conversion unit 170, thereby increasing the electrical current capacity from the upstream location. If a local UPS unit is used, the DC UPS unit 172 optionally provides power during a power outage and/or when power prom an upstream location is not available (i.e., no twisted pairs connected to an upstream central office). The DC-DC voltage conversion unit 170 and the DC UPS unit 172 being external to the MDU module 100 allows a single powering arrangement for the MDU module 100 regardless of whether power is primarily provided by the DC-DC voltage conversion unit 170 or by the DC UPS unit 172.

As depicted in FIG. 7, a method 200 for facilitating power management functionality in the event of a power demand overload condition or a power outage condition. The motherboard 116 is configured for implementing the power management functionality. The power management functionality controls power consumption associated with telephony service (e.g., POTS service) during an overload condition and provide lifeline power management for limiting power consumption associated with non-telephony service (e.g., DSL and/or video services) during a power outage condition.

The method 200 includes an operation 202, which is performed for monitoring power conditions of the MDU module 100. In the case where a power outage is identified, an operation 204 is performed for suspending non-telephony services and an operation 206 is performed for switching from a failed power source (e.g., a local AC power source) to a local power source (e.g., a uninterruptible power supply battery back-up). In the case where a power demand overload condition exists in addition to the power outage, an operation 208 is performed for implementing a reduced voltage ring strategy for the telephony services. Examples of such reduced voltage ring strategy include, but are not limited to, implementing partial ring functionality for POTS and reduced ring voltage for POTS. An example of a power demand overload condition is when ringing an inordinate number of POTS lines (e.g., in excess of specified parameters).

The method 200 then proceeds with the operation 202 for monitoring power conditions. When the overload condition subsides or is otherwise not present, the method 200 performs an operation 210 for facilitating normal ring voltage functionality. Upon power being restored or the power outage condition otherwise being absent, the method 200 performs an operation 212 for facilitating combined services (i.e., telephony services and non-telephony services). Through such power management functionality power supply capability is effectively managed during power demand overload conditions and/or during power outage conditions.

In the preceding detailed description, reference has been made to the accompanying drawings that form a part hereof, and in which are shown by way of illustration specific embodiments in which the invention may be practiced. These embodiments, and certain variants thereof, have been described in sufficient detail to enable those skilled in the art to practice the invention. It is to be understood that other suitable embodiments may be utilized and that logical, mechanical and electrical changes may be made without departing from the spirit or scope of the invention. For example, functional blocks shown in the figures could be further combined or divided in any manner without departing from the spirit or scope of the invention. To avoid unnecessary detail, the description omits certain information known to those skilled in the art. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A multi-dwelling unit (MDU) module, comprising:
   a plurality of service units each configured for providing non-telephony service and telephony service to a plurality of service subscribers, wherein each one of said service units includes a passive heat conducting member;
   a motherboard having each one of said service units connected thereto and configured for interacting with said service units for providing said non-telephony service and telephony service to said service subscribers, wherein the motherboard includes a passive heat conducting member and a thermal plane, with the passive heat conducting member engaged with the thermal plane;
   at least one passive heat dissipation assembly configured for absorbing and dissipating heat, wherein the passive heat conducting member of each one of said service units and the passive heat conducting member of the motherboard are conductively engaged with said at least one passive heat dissipation assembly, thereby enabling heat generated by said service units and the motherboard to be absorbed by said at least one passive heat dissipation assembly and to be convectively dissipated from said at least one passive heat dissipation assembly; and
   wherein the motherboard includes a printed circuit substrate having a first side, a second side and a thermal plane and the second side of the printed circuit substrate of the motherboard is adjacent the passive heat dissipating assembly and the passive heat conducting member of the motherboard is comprised by the printed circuit substrate and the passive heat conducting member of the motherboard extends through the printed circuit substrate of the motherboard between the first side and the second side and is engaged with the thermal plane of the motherboard.

2. The MDU module of claim 1 wherein:
   each one of said service units includes a respective inner service unit card attached to the motherboard and a respective outer service unit card attached to the inner service unit card;
   the respective inner service unit card of each one of said service units is positioned between the motherboard and the respective outer service unit card when a respective one of said service units is connected to the motherboard;
   the respective inner service unit card and the respective outer service unit card each include a printed circuit substrate;
   the printed circuit substrate of the respective inner service unit card has a first side, a second side and a thermal plane;
   the second side of the printed circuit substrate of the respective inner service unit card of each one of said service units is adjacent the passive heat dissipating assembly;
   the passive heat conducting member of each one of said service units is comprised by the printed circuit substrate of the respective inner service unit card; and
   the passive heat conducting member of each one of said service unit extends through the printed circuit substrate of the respective inner service unit card between the first side and the second side and is engaged with the thermal plane of the respective inner service unit card.

3. The MDU module of claim 2 wherein:
   the inner service unit card exclusively carries respective heat generating components of digital service line (DSL) circuitry; and
   the outer service unit card exclusively carries respective heat generating components of telephony circuitry.

4. The MDU module of claim 2 further comprising:
   a MDU module enclosure including a rear wall having a metal portion, wherein the motherboard is mounted on the MDU module enclosure and wherein said at least one passive heat dissipation assembly includes the metal portion of the rear wall and at least one thermal pad engaged between the rear wall and the passive heat conducting member of the motherboard and between the metal portion of the rear wall and the passive heat conduction member of each one of said service units; and at least one discrete heat sink body attached to the metal portion of the rear wall, wherein said at least one thermal pad is engaged with a first side of the metal portion of the rear wall and said at least one discrete heat sink body is engaged with a second side of the metal portion of the rear wall.

5. A multi-dwelling unit (MDU) module, comprising:
a motherboard;
a plurality of service units connected to the motherboard, wherein each one of said service units includes a respective inner service unit card detachably attached to the motherboard and a respective outer service unit card detachably attached to the respective inner service unit card and wherein the respective inner service unit card is positioned between the motherboard and the respective outer service unit card when a corresponding one of said service units is connected to the motherboard;
the motherboard including a passive heat conducting member and a thermal plane, with the passive heat conducting member engaged with the thermal plane;
the respective inner service unit card and the respective outer service unit card of each one of said service units include mating connectors that interconnect for enabling interoperability therebetween when the respective inner service unit card and the outer service unit card of a corresponding one of said service units are attached and that disconnect when the respective inner service unit card and the respective outer service unit card are detached;
at least one passive heat dissipation assembly configured for absorbing and dissipating heat, wherein each one of said service units includes a passive heat conducting member, wherein the passive heat conducting member of each one of said service units and the passive heat conducting member of the motherboard are conductively engaged with said at least one passive heat dissipation assembly, thereby enabling heat generating by said service units and the motherboard to be absorbed by said at least one passive heat dissipation assembly and to be convectively dissipated from said at least one passive heat dissipation assembly;
wherein the respective inner service unit card and the respective outer service unit card of each one of said service units each include a printed circuit substrate;
wherein the printed circuit substrate of the respective inner service unit card has a first side, a second side and thermal plane;
wherein the second side of the printed circuit substrate of the respective inner service unit card of each one of said service units is adjacent the passive heat dissipating assembly;
wherein the passive heat conducting member of each one of said service units is comprised by the printed circuit substrate of the respective inner service unit card; and
wherein the passive heat conducting member of each one of said service units extends through the printed circuit substrate of the respective inner service unit card between the first side and the second side and is engaged with the thermal plane of the respective inner service unit card.

6. A multi-dwelling unit (MDU) module, comprising:
a motherboard;
a plurality of service units connected to the motherboard, wherein each one of said service units includes a respective inner service unit card detachably attached to the motherboard and a respective outer service unit card detachably attached to the respective inner service unit card and wherein the respective inner service unit card is positioned between the motherboard and the respective outer service unit card when a corresponding one of said service units is connected to the motherboard;
the motherboard including a passive heat conducting member and a thermal plane, with the passive heat conducting member engaged with the thermal plane;
at least one passive heat dissipation assembly configured for absorbing and dissipating heat
wherein each one of said service units includes a passive heat conducting member;
wherein the passive heat conducting member of each one of said service units and the passive heat conducting member of the motherboard are conductively engaged with said at least one passive heat dissipation assembly, thereby enabling heat generated by said service units and the motherboard to be absorbed by said at least one passive heat dissipation assembly and to be convectively dissipated from said at least one passive heat dissipation assembly;
wherein the inner service unit card exclusively carries respective heat generating components of digital service line (DSL) circuitry;
wherein the outer service unit card exclusively carries respective heat generating components of telephony circuitry;
wherein the respective inner service unit card and the respective outer service unit card of each one of said service units including mating connectors that interconnect for enabling interoperability therebetween when the respective inner service unit card and the outer service unit card of a corresponding one of said service units are attached and that disconnect when the respective inner service unit card and the respective outer service unit card are detached;
wherein the respective inner service unit card and the respective outer service unit card of each one of said service units each include a printed circuit substrate;
wherein the printed circuit substrate of the respective inner service unit card has a first side, a second side and a thermal plane;
wherein the second side of the printed circuit substrate of the respective inner service unit card of each one of said service units is adjacent the passive heat dissipating assembly;
wherein the passive heat conducting member of each one of said service units is comprised by the printed circuit substrate of the respective inner service unit card; and
wherein the passive heat conducting member of each one of said service units extends through the printed circuit substrate of the respective inner service unit card between the first side and the second side and is engaged with the thermal plane of the respective inner service unit card.

* * * * *

UNITED STATES PATENT AND TRADEMARK OFFICE
CERTIFICATE OF CORRECTION

| | | |
|---|---|---|
| PATENT NO. | : 7,660,409 B1 | Page 1 of 1 |
| APPLICATION NO. | : 11/026123 | |
| DATED | : February 9, 2010 | |
| INVENTOR(S) | : Czerwiec et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1420 days.

Signed and Sealed this

Twenty-eighth Day of December, 2010

David J. Kappos
*Director of the United States Patent and Trademark Office*